(12) United States Patent
Qing et al.

(10) Patent No.: US 9,007,294 B2
(45) Date of Patent: Apr. 14, 2015

(54) SHIFTING REGISTER, GATE DRIVING APPARATUS AND DISPLAY APPARATUS

(71) Applicants: BOE Technology Group Co., Ltd., Beijing (CN); Chengdu BOE Optoelectronics Technology Co., Ltd., Chengdu (CN)

(72) Inventors: Haigang Qing, Beijing (CN); Xiaojing Qi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 13/994,047

(22) PCT Filed: Nov. 23, 2012

(86) PCT No.: PCT/CN2012/085198
§ 371 (c)(1),
(2) Date: Jun. 13, 2013

(87) PCT Pub. No.: WO2013/127207
PCT Pub. Date: Sep. 6, 2013

(65) Prior Publication Data
US 2014/0055334 A1   Feb. 27, 2014

(30) Foreign Application Priority Data
Mar. 2, 2012   (CN) .......................... 2012 1 0054127

(51) Int. Cl.
*G09G 3/36*   (2006.01)
*G09G 5/10*   (2006.01)
*G11C 19/28*   (2006.01)
*G09G 3/20*   (2006.01)

(52) U.S. Cl.
CPC ................ *G11C 19/287* (2013.01); *G09G 3/20* (2013.01); *G09G 3/3611* (2013.01)

(58) Field of Classification Search
USPC .......... 345/211, 212, 208, 205, 173, 178, 691
See application file for complete search history.

(56) References Cited

U.S. PATENT DOCUMENTS

2011/0007049 A1*  1/2011  Kikuchi et al. ................ 345/208
2011/0012880 A1*  1/2011  Tanaka et al. .................. 345/211

* cited by examiner

Primary Examiner — Michael Faragalla (57) ABSTRACT

A shifting register, a gate driving apparatus and a display apparatus comprising the shifting register. The shifting register comprises a latch (21), a transmission gate (22), a first TFT (T1), a second TFT (T2), a third TFT (T3) and a first inverter (23), the first TFT (T1), having a gate connected to a reset (Reset) of the shifting register, a drain connected to a drain of the second TFT (T2) and an input (M) of the latch (21) respectively; the second TFT (T2), having a gate connected to an input (Input) of the shifting register, the third TFT (T3), having a gate connected to the inverting output of the latch (21), a drain connected to an input of the first inverter (23); an output of the transmission gate being connected to a drain of the third TFT (T3), an input of the transmission gate being connected to a clock signal input (CLOCK); the drain of the third TFT (T3) being connected to a non-inverting output (Output_Q) of the shifting register, an output of the first inverter being connected to an inverting output (Output_QB) of the shifting register. The shifting register achieves a signal shift with only one latch (21).

12 Claims, 5 Drawing Sheets

SHIFTING REGISTER, GATE DRIVING APPARATUS AND DISPLAY APPARATUS

CROSS REFERENCE TO RELATED APPLICATIONS

This application is based on International Application No. PCT/CN2012/085198 filed on Nov. 23, 2012, which claims priority to Chinese Application No. 201210054127.2 filed Mar. 2, 2012, the contents of which are incorporated herein by reference.

FIELD OF INVENTION

The present invention relates to the field of display technology, and particularly to a shifting register, a gate driving apparatus and a display apparatus.

BACKGROUND

Conventional LTPS (low-temperature-polycrystalline-silicon) shifting registers are comprised of inverters and transmission gates, and typically have two latches. The latches are used to latch output signals and switches of the transmission gates are used to achieve delay and shift of the signals.

Figure 1:
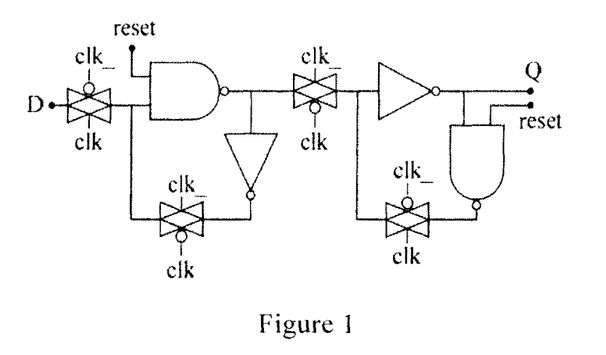
FIG. 1 is a circuit diagram of a conventional shifting register.

FIG. 1 shows a conventional shifting register that is mainly comprised of two D-triggers, and has D as the input, Q as the output, reset as the reset, and clk_ and clk as two (mutually) inverted clock signals with its principle of operation being that, when a clock turns on a first D-trigger, a level signal inputted from the previous stage shifting register enters into the first D-trigger, and cannot enter into a second D-trigger as the transmission gate at the front end of the second D-trigger is off at that time, and with the arrival of a next clock, the input of the first D-trigger is turned off while the first D-trigger latches the input signal, at the same time the second D-triggers is turned on and the input signal enters into the second D-trigger and is outputted. Thus a shift-operation from the previous stage shifting register to the next stage shifting register is achieved for the signal. For achieving a D-trigger, two transmission gates, one inverter and one NAND gate are required, while two D-triggers are required for one shifting register. Although the conventional shifting registers are deemed classic, they are not favorable for achieving a panel narrow frame as more gate circuits have been used, circuit composition are too complicated and bigger layout space is needed.

SUMMARY

An aspect of the present invention provides a shifting register, a gate driving apparatus and a display apparatus, and to achieve a signal shift with only one latch.

For the above mentioned, an embodiment of the present invention provides a shifting register, comprising a latch, a transmission gate, a first TFT (Thin Film Transistor), a second TFT, a third TFT and a first inverter, wherein, the first TFT having a gate connected to a reset of the shifting register, a source connected to a high-level output of a driving power, and a drain connected to a drain of the second TFT and an input of the latch respectively;

the second TFT having a gate connected to an input of the shifting register, a source connected to a low-level output of the driving power;

a non-inverting output of the latch being connected to a non-inverting control of the transmission gate, an inverting output of the latch is connected to an inverting control of the transmission gate;

the third TFT having a gate connected to the inverting output of the latch, a source connected to the low-level output of the driving power, and a drain connected to an input of the first inverter;

an output of the transmission gate being connected to a drain of the third TFT, an input of the transmission gate is connected to a clock signal input;

the drain of the third TFT being connected to a non-inverting output of the shifting register, an output of the first inverter is connected to an inverting output of the shifting register.

In an embodiment of the present invention, the first TFT is a p-type TFT;

the second TFT and the third TFT are n-type TFTs.

In an embodiment of the present invention, the latch comprises a second inverter and a third inverter, wherein, an input of the second inverter being connected to an output of the third inverter;

an output of the second inverter being connected to an input of the third inverter;

the output of the second inverter being the input of the latch; the output of the second inverter being the non-inverting output of the latch;

the output of the third inverter being the inverting output of the latch.

In an embodiment of the present invention, the third inverter comprises a fourth TFT and a fifth TFT, the second inverter comprises a sixth TFT and a seventh TFT;

the fourth TFT having a gate connected to a non-inverting control of the transmission gate, a source connected to a high-level output of a driving power, and a drain connected to a drain of the first TFT;

the fifth TFT having a gate connected to a non-inverting control of the transmission gate, a source connected to a low-level output of the driving power, and a drain connected to the drain of the first TFT;

the sixth TFT having a gate connected to the drain of the first TFT and an inverting control of the transmission gate respectively, a source connected to the high-level output of the driving power, and a drain connected to the non-inverting control of the transmission gate;

the seventh TFT having a gate connected to the drain of the first TFT and the inverting control of the transmission gate respectively, a source connected to the low-level output of the driving power, and a drain connected to the non-inverting control of the transmission gate;

the drain of the sixth TFT being the non-inverting output of the latch;

the drain of the fourth TFT being the inverting output of the latch;

the gate of the sixth TFT being the output of the second inverter, the gate of the fourth TFT being the input of the third inverter;

the fourth TFT and the sixth TFT being p-type TFTs;

the fifth TFT and the seventh TFT being n-type TFTs.

In an embodiment of the present invention, the transmission gate comprises an eighth TFT and a ninth TFT;

a source of the eight TFT being connected to a drain of the ninth TFT, and a source of the ninth TFT is connected to the drain of the eighth TFT;

the eighth TFT having the gate connected to the non-inverting output of the shifting register, the drain connected to a clock signal input;

the gate of the eighth TFT being the non-inverting control of the transmission gate, the gate of the ninth TFT being the inverting control of the transmission gate;

the eighth TFT being a n-type TFT and the ninth TFT being a p-type TFT.

In an embodiment of the present invention, the first inverter comprises a tenth TFT and an eleventh TFT, wherein, the tenth TFT having a gate connected to the non-inverting output of the shifting register and a gate of the eleventh TFT respectively, a source connected to the low-level output of the driving power, and a drain connected to an inverting output of the shifting register and a drain of the eleventh TFT respectively;

the eleventh TFT having a source connected to the high-level output of the driving power;

the gate of the tenth TFT being the input of the first inverter, and the drain of the tenth TFT is the output of the first inverter;

the tenth TFT being an n-type TFT and the eleventh TFT T11 being a p-type TFT.

An embodiment of the present invention also provides a gate driving apparatus, comprising multiple stages of the above-mentioned shifting registers, except a first-stage shifting register, the input of each shifting register is connected to the non-inverting output of the immediate previous stage shifting register; the input of the first-stage shifting register is connected to a starting signal input; except a last-stage shifting register, the reset of each of the remaining shifting registers is connected inverting output of the immediate next stage shifting register; the reset of the last-stage shifting register is connected to the non-inverting output of said last-stage shifting register.

An embodiment of the present invention also provides a display apparatus characterizing in that it comprises the above gate driving apparatus.

Compared with the prior art, the shifting register, gate driving apparatus and display apparatus according to the embodiments of the present invention uses a latch to latch control signals of the transmission gate, allowing the transmission gate to remain at an on or off status, and uses the status of the transmission gate to selectively input a clock signal in order to achieve shifts of the signals.

DETAILED DESCRIPTION

The objective, technical solution and advantages of the present invention will become more fully understood and obvious from the detailed description given hereinafter by referring to the accompanying drawings and specific embodiments.

An embodiment of the present invention provide a shifting register, a gate driving apparatus and a display apparatus, and achieves a signal shift with only one latch. The shifting register according to the embodiment of the present invention is mainly comprised of a latch and a transmission gate, the latch being used for latching a control signal of said transmission gate, so that said transmission gate may remain ON or OFF status, utilizing the status of said transmission gate to selectively input a clock signal so as to achieve the shift of signals.

Figure 2:
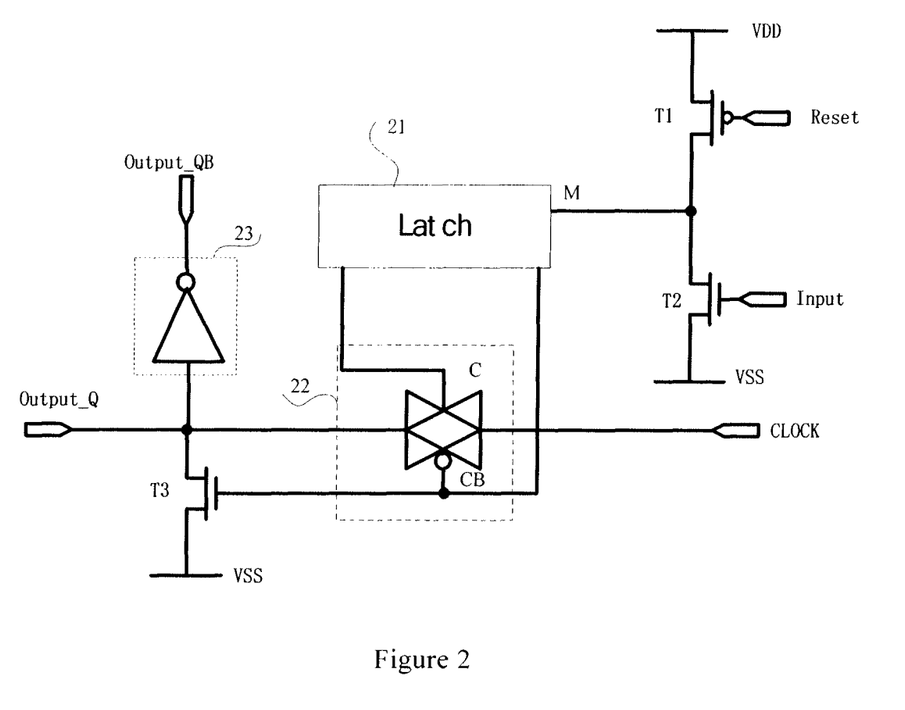
FIG. 2 is a circuit diagram of a shifting register according to a first embodiment of the present invention.

As shown in FIG. 2, the shifting register according to the first embodiment of the present invention comprises a latch 21, a transmission gate 22, a first TFT T1, a second TFT T2, a third TFT T3 and a first inverter 23, wherein, the first TFT T1, having a gate connected to a reset Reset of the shifting register, a source connected to a high-level output of a driving power, and a drain connected to a drain of the second TFT T2 and an input M of the latch 21 respectively;

the second TFT T2, having a gate connected to an input Input of the shifting register, a source connected to a low-level output of the driving power;

a non-inverting output of the latch 21 is connected to a non-inverting control C of the transmission gate 22, an inverting output of the latch 21 is connected to an inverting control CB of the transmission gate 22;

the third TFT T3, having a gate connected to the inverting output of the latch 21, a source connected to the low-level output of the driving power, and a drain connected to an input of the first inverter 23;

an output of the transmission gate 22 being connected to a drain of the third TFT T3, an input of the transmission gate 22 being connected to a clock signal input CLOCK;

the drain of the third TFT T3 being connected to a non-inverting output Output_Q of the shifting register, an output of the first inverter 23 being connected to an inverting output Output_QB of the shifting register;

the output voltage at the high-level output of the driving power being VDD, and the output voltage at the low-level output of the driving power being VSS;

the latch 21 is used for programming and latching a control signal of the transmission gate 22;

the first TFT T1 being a p-type TFT;

the second TFT T2 and the third TFT T3 being n-type TFTs.

As an alternative, when the first TFT T1 is of n-type while the second TFT T2 and the third TFT T3 are both of the p-type, the same function may be achieved by accordingly adjusting the input timing signals.

During the operation of the shifting register according to the embodiment of the present invention, assuming that initially the transmission gate is off, and the output voltage of Output_Q is at low level; when a high-level is input at the input Input of the shifting register, T2 turns on, a low-level is latched at M, meanwhile the transmission gate 22 turns on; when a low-level is input at the reset Rest of the shifting register, T1 turns on, a high-level is latched at M, meanwhile the transmission gate 22 turns off, and T3 turns on so that the output voltage of the Output_Q becomes low-level.

Figure 3:
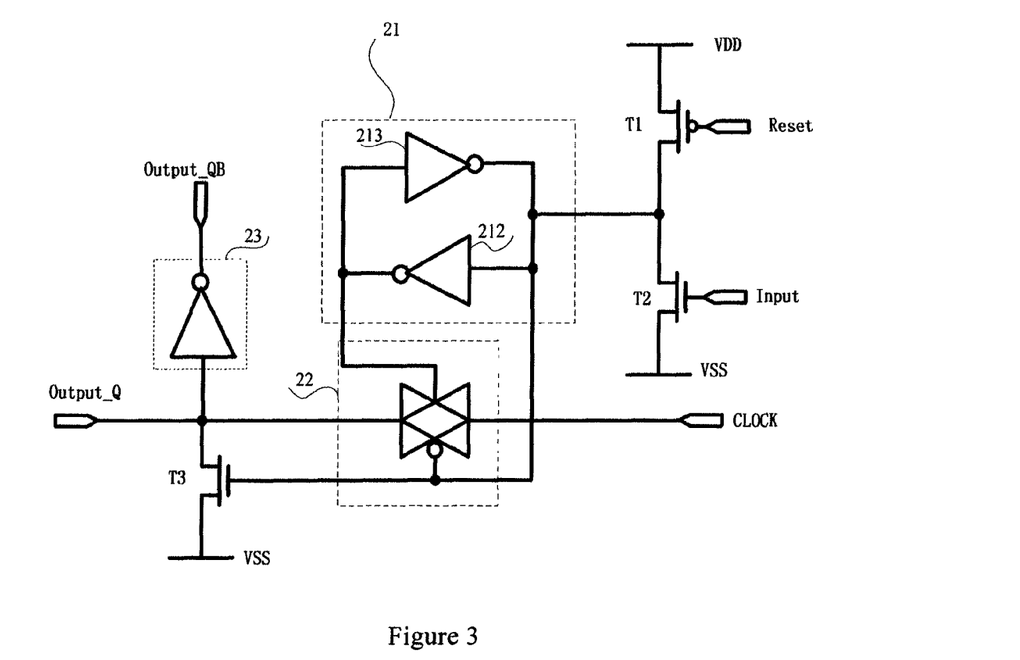
FIG. 3 is a circuit diagram of a shifting register according to a second embodiment of the present invention.

As shown in FIG. 3, a shifting register according to a second embodiment of the present invention is based on the shifting register according to the first embodiment of the present invention. In the shifting register according to the second embodiment of the present invention, the latch 21 comprises a second inverter 212 and a third inverter 213, wherein, an input of the second inverter 212 being connected to an output of the third inverter 213;

an output of the second inverter 212 being connected to an input of the third inverter 213;

the output of the second inverter 212 being the input of the latch 21; the output of the second inverter 212 being the non-inverting output of the latch 21;

the output of the third inverter 213 being the inverting output of the latch 21.

Figure 4:
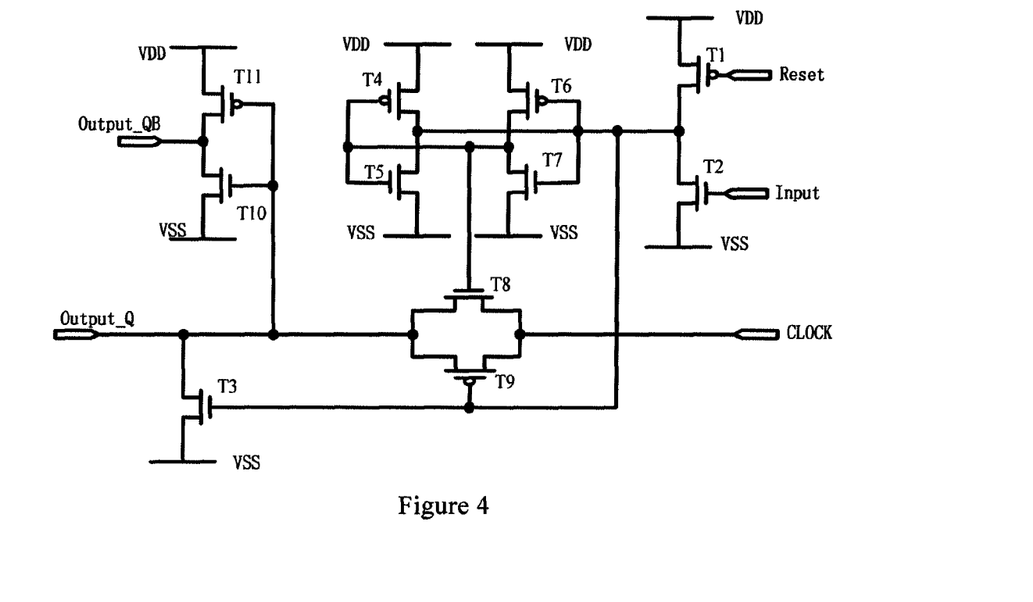
FIG. 4 is a circuit diagram of a shifting register according to a third embodiment of the present invention.

As shown in FIG. 4, a shifting register according to a third embodiment of the present invention is based on the shifting register according to the second embodiment of the present invention. In the shifting register according to the third embodiment:

the third inverter comprises a fourth TFT T4 and a fifth TFT T5, the second inverter comprises a sixth TFT T6 and a seventh TFT T7;

the transmission gate comprises an eighth TFT T8 and a ninth TFT T9;

the first inverter comprises a tenth TFT T10 and an eleventh TFT T11;

the fourth TFT T4 has a gate connected to a gate of the eight TFT T8, a source connected to a high-level output of a driving power, and a drain connected to a drain of the first TFT T1;

the fifth TFT T5 has a gate connected to the gate of the eighth TFT T8, a source connected to a low-level output of the driving power, and a drain connected to the drain of the first TFT T1;

the sixth TFT T6 has a gate connected to the drain of the first TFT T1 and a gate of the ninth TFT T9 respectively, a source connected to the high-level output of the driving power, and a drain connected to the gate of the eighth TFT T8;

the seventh TFT T7 has a gate connected to the drain of the first TFT T1 and the gate of the ninth TFT T9 respectively, a source connected to the low-level output of the driving power, and a drain connected to the gate of the eighth TFT T8;

the drain of the sixth TFT T6 is the non-inverting output of the latch, and the drain of the fourth TFT T4 is the inverting output of the latch;

the gate of the sixth TFT T6 is the output of the second inverter, and the gate of the fourth TFT T4 is the input of the third inverter;

the fourth TFT T4 and the sixth TFT T6 are p-type TFTs;

the fifth TFT T5 and the seventh TFT T7 are n-type TFTs;

a source of the eight TFT T8 is connected to a drain of the ninth TFT T9, and a source of the ninth TFT T9 is connected to the drain of the eighth TFT T8;

the eighth TFT T8 has the gate connected to the gate of the fourth TFT T4, a source connected to a non-inverting output Output_Q of the shifting register, and the drain connected to a clock signal input CLOCK;

a gate of the ninth TFT T9 is connected to a gate of the third TFT T3, a drain of the first TFT T1 and the gate of the sixth TFT T6 respectively;

the gate of the eighth TFT T8 is the non-inverting control of the transmission gate, the gate of the ninth TFT T9 is the inverting control of the transmission gate;

the eighth TFT T8 is a n-type TFT and the ninth TFT T9 is a p-type TFT;

the tenth TFT T10 has a gate connected to the non-inverting output Output_Q of the shifting register and a gate of the eleventh TFT T11 respectively, a source connected to the low-level output of the driving power, and a drain connected to an inverting output Output_QB of the shifting register and a drain of the eleventh TFT T11 respectively;

the eleventh TFT T11 has a source connected to the high-level output of the driving power;

the gate of the tenth TFT T10 is the input of the first inverter, and the drain of the tenth TFT T10 is the output of the first inverter;

the tenth TFT T10 is a n-type TFT and the eleventh TFT T11 is a p-type TFT.

Figure 5:
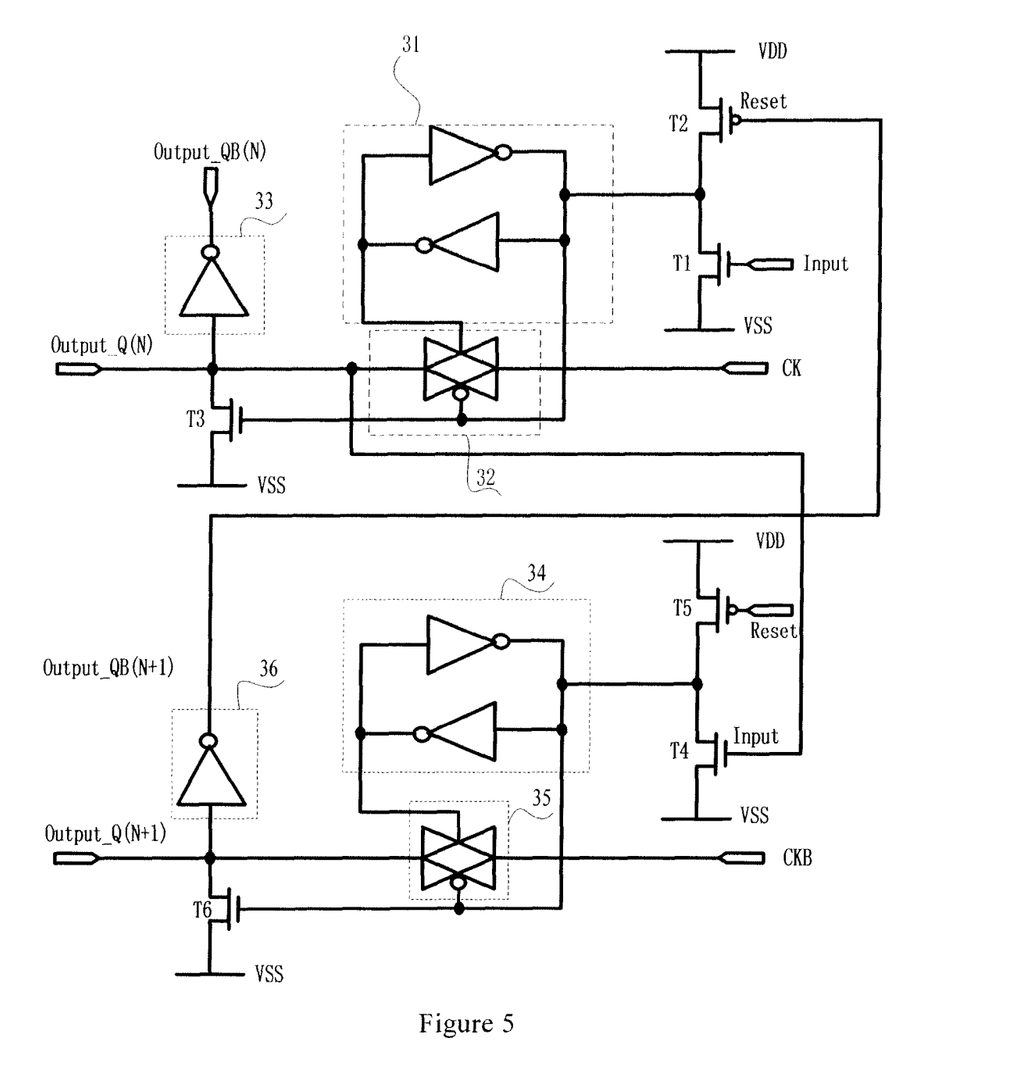
FIG. 5 is a circuit diagram of two-stage-cascade-connection of the shifting registers according to the second embodiment of the present invention.

FIG. 5 shows a circuit diagram of a two-stage-cascade-connection of the shifting registers according to the second embodiment of the present invention. In FIG. 5, Ck is a clock signal, CKB is a clock signal being inverted to CK, Output_Q (N) is the non-inverting output of the Nth stage shifting register, Output_QB(N) is the inverting output of the Nth stage shifting register, the input Input of the (N+1)th stage shifting register is connected to the non-inverting output Output_Q (N) of the Nth stage shifting register, the reset Rest of the Nth stage shifting register is connected to the inverting output Output_QB(N+1) of the (N+1)th stage shifting register; the Nth stage shifting register comprises a first TFT T1, a second TFT T2, a third TFT T3, a latch 31, a transmission gate 32 and an inverter 33; the (N+1)th stage shifting register comprises a fourth TFT T4, a fifth TFT T5, a sixth TFT T6, a latch 34, a transmission gate 35 and an inverter 36; and the structures of the Nth stage shifting register and the (N+1)th stage shifting register are the same as that of the shifting register as shown in FIG. 2.

Figure 6:
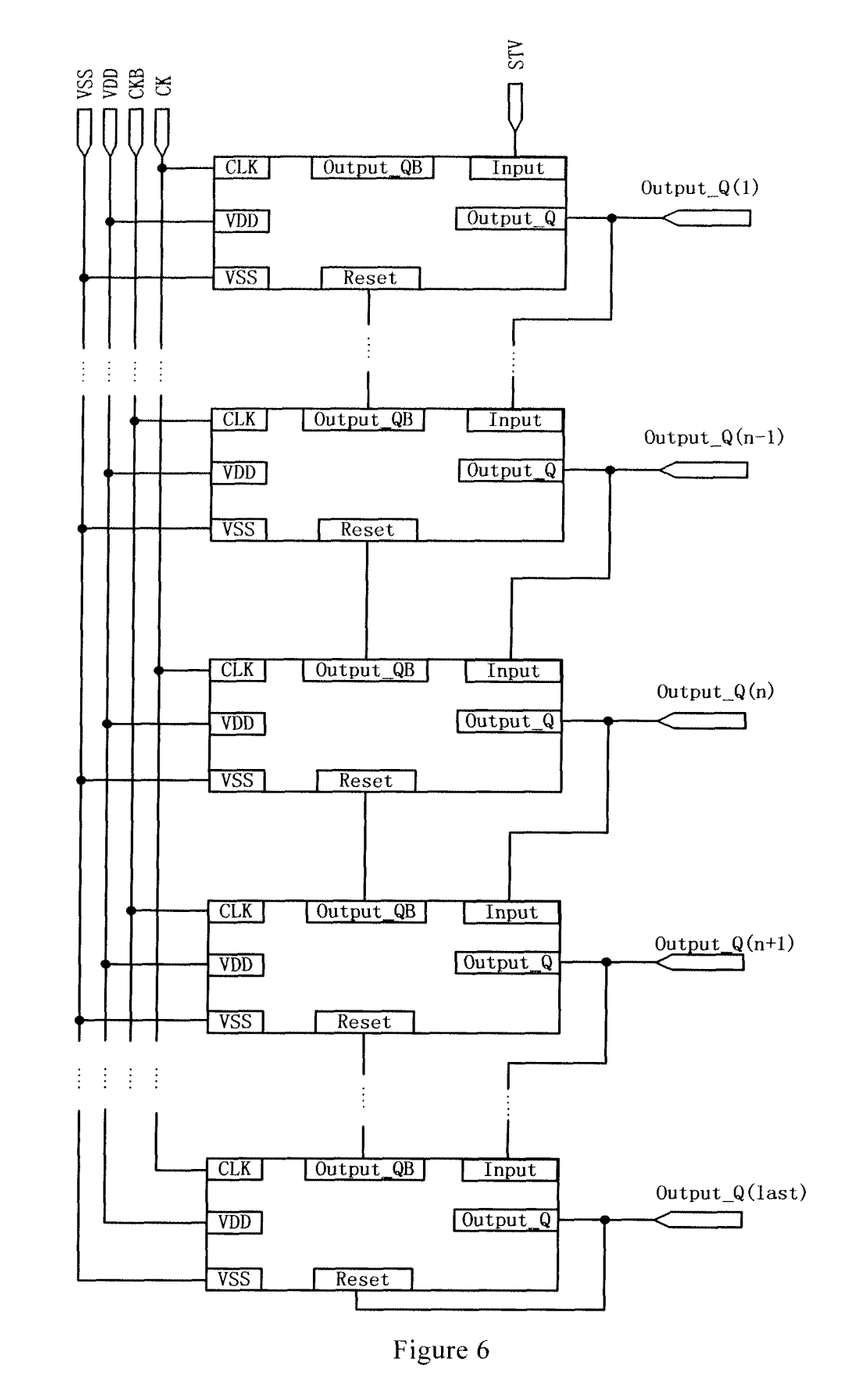
FIG. 6 is circuit diagram of a gate driving apparatus according to an embodiment of the present invention.

As shown in FIG. 6, an embodiment of the present invention provides a gate driving apparatus, comprising multiple stages of shift registers as described above, and the input of each shifting register (except the first-stage-shift-register) is connected to the non-inverting output of the previous stage shifting register immediately connected with that shifting register; the input Input of the first stage shifting register is connected to a starting signal input, said stating signal input inputs a starting signal STV; except the last-stage-shift-register, the reset Reset of each of the remaining shifting registers is connected inverting output of the next stage shifting register immediately connected with that shifting register; the reset Reset of the last-stage-shift-register is connected to the non-inverting output of said last-stage-shift-register.

Figure 7:
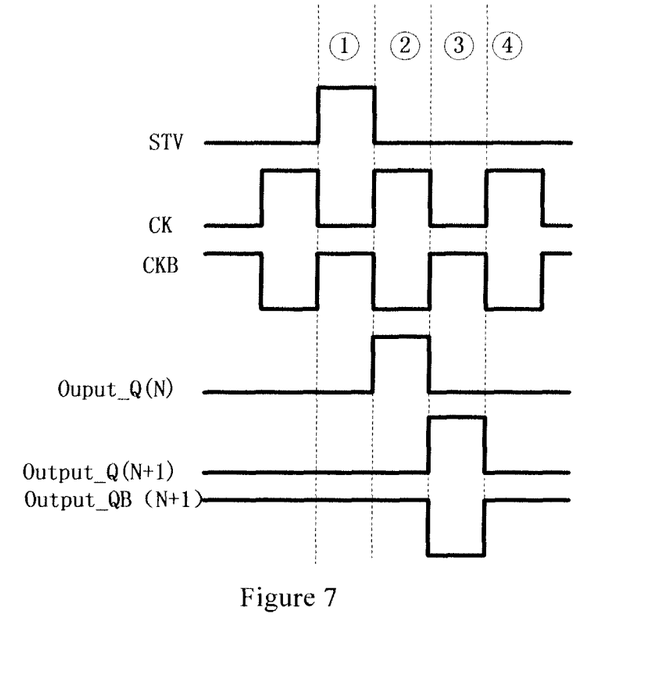
FIG. 7 is the timing chart of the shifting register of the present invention.

As shown in FIG. 7, the operation timing of the shifting registers in cascade-connection shown in FIG. 5 is as follows:

Phase 1: the non-inverting output of the (N−1)th stage shifting register unit outputs a high-level signal, as the STV signal being input at the input Input of the Nth stage shifting register, at that time T1 turns on so that the potential at M is pulled down to a low-level, said low-level is latched by latch 31, T3 turns off, meanwhile the transmission gate 32 turns on, at that time CK is at low-level and the output signal of Output_Q(N) is at low-level; for the (N+1)th stage shifting register, the transmission gate 35 turns off, at that time although CKB is at high-level, it can not be output at the non-inverting output Output_Q(N+1) of the (N+1)th stage shifting register, while T6 turns on, Output_Q(N+1) outputs a low-level signal, Output_QB(N+1) outputs a high-level signal which turns off T2.

Phase 2: CK is at high-level, CKB is at low-level, the STV signal is at low-level, T1 is off, but as the latch 31 latches the low-level from the previous stage, the transmission gate 32 is still on, and consequently the high-level of CK is output from Output_Q(N) via the transmission gate 32, while high-level output from Output_Q(N) inputs to the input Input of the (N+1)th stage shifting register, T4 turns on, the potential at N is pulled down to a low-level, the latch 34 likewise latches the low-level at N, T6 turns off, the transmission gate 35 turns on, the low-level of CKB is output from Output_Q(N+1) via the transmission gate 35, a high-level is output from the inverting output Output_QB(N+1) of the (N+1)th stage shifting register and T2 turns off.

Phase 3: Ck is at low-level, CKB is at high-level, T4 is off and T5 is off too at that time, likewise the latch 34 of the (N+1)th stage shifting register latches the low-level at N from the previous stage, and consequently the transmission gate 35 of the (N+1)th stage shifting register still turns on, T6 turns off, the high-level of CKB is output via the transmission gate 35, a high-level is output at Output_Q(N+1), a low-level is output at Output_QB(N+1), the low-level is fed back to the input of the Nth stage shifting register so that T2 turns on, the potential at M is pulled up, the latch 31 latches the high-level potential while turning off the transmission gate 32, thus T3 turns on and a low-level is output at Output_Q(N).

Phase 4: a signal fed back from the inverting output Output_QB(N+2) of the (N+2)th stage shifting register (not shown in FIG. 5) turns of the transmission gate of the (N+1)th stage while causing the output signal of Output_Q(N+1) pulled down to a low-level.

In the present inventions, latches have been used for latching control signals of the transmission gate, allowing the transmission gate to remain at an on or off status, and the status of the transmission gate has been used to selectively input a clock signal in order to achieve shifts of the signals.

The above descriptions are deemed to be rather illustrative than limitative to the present invention. It will be understood by persons skilled in the art that many modifications, variations or equivalence may be made without departure from the spirit and scope of the invention, and all such modifications as would be obvious to those skilled in the art are intended to be included within the scope of the following claims.

What is claimed is:

1. A shifting register, comprising: a latch, a transmission gate, a first TFT, a second TFT, a third TFT and a first inverter, wherein, the first TFT, having a gate connected to a reset of the shifting register, a source connected to a high-level output of a driving power, and a drain connected to a drain of the second TFT and an input of the latch respectively;

the second TFT, having a gate connected to an input of the shifting register, a source connected to a low-level output of the driving power;

a non-inverting output of the latch being connected to a non-inverting control of the transmission gate, an inverting output of the latch being connected to an inverting control of the transmission gate;

the third TFT, having a gate connected to the inverting output of the latch, a source connected to the low-level output of the driving power, and a drain connected to an input of the first inverter;

an output of the transmission gate being connected to a drain of the third TFT, an input of the transmission gate being connected to a clock signal input;

the drain of the third TFT being connected to a non-inverting output of the shifting register, an output of the first inverter being connected to an inverting output of the shifting register;

if the first TFT is a p-type TFT, the second TFT and the third TFT are n-type TFTs;

if the first TFT is a n-type TFT, the second TFT and the third TFT are p-type TFTs.

2. The shifting register according to claim 1, wherein, the latch comprising a second inverter and a third inverter, wherein, an input of the second inverter being connected to an output of the third inverter;

an output of the second inverter being connected to an input of the third inverter;

the output of the second inverter being the input of the latch; the output of the second inverter being the non-inverting output of the latch;

the output of the third inverter being the inverting output of the latch.

3. The shifting register according to claim 2, the third inverter comprising a fourth TFT and a fifth TFT, the second inverter comprising a sixth TFT and a seventh TFT;

the fourth TFT having a gate connected to a non-inverting control of the transmission gate, a source connected to a high-level output of a driving power, and a drain connected to a drain of the first TFT;

the fifth TFT having a gate connected to a non-inverting control of the transmission gate, a source connected to a low-level output of the driving power, and a drain connected to the drain of the first TFT;

the sixth TFT having a gate connected to the drain of the first TFT and an inverting control of the transmission gate respectively, a source connected to the high-level output of the driving power, and a drain connected to the non-inverting control of the transmission gate;

the seventh TFT having a gate connected to the drain of the first TFT and the inverting control of the transmission gate respectively, a source connected to the low-level output of the driving power, and a drain connected to the non-inverting control of the transmission gate;

the drain of the sixth TFT being the non-inverting output of the latch;

the drain of the fourth TFT being the inverting output of the latch;

the gate of the sixth TFT being the input of the second inverter, the gate of the fourth TFT being the input of the third inverter;

the fourth TFT and the sixth TFT being p-type TFTs;

the fifth TFT and the seventh TFT being n-type TFTs.

4. The shifting register according to claim 3, wherein, the transmission gate comprising an eighth TFT and a ninth TFT;

a source of the eight TFT being connected to a drain of the ninth TFT, and a source of the ninth TFT being connected to the drain of the eighth TFT;

the eighth TFT having the gate connected to the non-inverting output of the shifting register, the drain connected to a clock signal input;

the gate of the eighth TFT being the non-inverting control of the transmission gate, the gate of the ninth TFT being the inverting control of the transmission gate;

the eighth TFT being a n-type TFT and the ninth TFT being a p-type TFT.

5. The shifting register according to claim 4, wherein the first inverter comprising a tenth TFT and an eleventh TFT, wherein, the tenth TFT having a gate connected to the non-inverting output of the shifting register and a gate of the eleventh TFT respectively, a source connected to the low-level output of the driving power, and a drain connected to an inverting output of the shifting register and a drain of the eleventh TFT respectively;

the eleventh TFT having a source connected to the high-level output of the driving power;

the gate of the tenth TFT being the input of the first inverter, and the drain of the tenth TFT being the output of the first inverter;

the tenth TFT being a n-type TFT and the eleventh TFT T11 being a p-type TFT.

6. A gate driving apparatus, comprising multiple stages of the shifting registers, except a first-stage shifting register, the input of each shifting register being connected to the non-inverting output of the immediate previous stage shifting register; the input of the first-stage shifting register being connected to a starting signal input; except a last-stage shifting register, the reset of each of the remaining shifting registers being connected inverting output of the immediate next stage shifting register; the reset of the last-stage shifting register being connected to the non-inverting output of said last-stage shifting register, wherein, the shifting register comprises: a latch, a transmission gate, a first TFT, a second TFT, a third TFT and a first inverter, wherein, the first TFT, having a gate connected to a reset of the shifting register, a source connected to a high-level output of a driving power, and a drain connected to a drain of the second TFT and an input of the latch respectively;

the second TFT, having a gate connected to an input of the shifting register, a source connected to a low-level output of the driving power;

a non-inverting output of the latch being connected to a non-inverting control of the transmission gate, an inverting output of the latch being connected to an inverting control of the transmission gate;

the third TFT, having a gate connected to the inverting output of the latch, a source connected to the low-level output of the driving power, and a drain connected to an input of the first inverter;

an output of the transmission gate being connected to a drain of the third TFT, an input of the transmission gate being connected to a clock signal input;

the drain of the third TFT being connected to a non-inverting output of the shifting register, an output of the first inverter being connected to an inverting output of the shifting register.

7. A display apparatus that comprises the gate driving apparatus comprising multiple stages of the shifting registers, except a first-stage shifting register, the input of each shifting register being connected to the non-inverting output of the immediate previous stage shifting register; the input of the first-stage shifting register being connected to a starting signal input; except a last-stage shifting register, the reset of each of the remaining shifting registers being connected inverting output of the immediate next stage shifting register; the reset of the last-stage shifting register being connected to the non-inverting output of said last-stage shifting register, wherein, the shifting register comprises: a latch, a transmission gate, a first TFT, a second TFT, a third TFT and a first inverter, wherein, the first TFT, having a gate connected to a reset of the shifting register, a source connected to a high-level output of a driving power, and a drain connected to a drain of the second TFT and an input of the latch respectively;

the second TFT, having a gate connected to an input of the shifting register, a source connected to a low-level output of the driving power;

a non-inverting output of the latch being connected to a non-inverting control of the transmission gate, an inverting output of the latch being connected to an inverting control of the transmission gate;

the third TFT, having a gate connected to the inverting output of the latch, a source connected to the low-level output of the driving power, and a drain connected to an input of the first inverter;

an output of the transmission gate being connected to a drain of the third TFT, an input of the transmission gate being connected to a clock signal input;

the drain of the third TFT being connected to a non-inverting output of the shifting register, an output of the first inverter being connected to an inverting output of the shifting register.

8. The shifting register according to claim 1, wherein the latch comprising a second inverter and a third inverter, wherein, an input of the second inverter being connected to an output of the third inverter;

an output of the second inverter being connected to an input of the third inverter;

the output of the second inverter being the input of the latch; the output of the second inverter being the non-inverting output of the latch;

the output of the third inverter being the inverting output of the latch.

9. The gate driving apparatus according to claim 6, wherein, the latch comprising a second inverter and a third inverter, wherein, an input of the second inverter being connected to an output of the third inverter;

an output of the second inverter being connected to an input of the third inverter;

the output of the second inverter being the input of the latch; the output of the second inverter being the non-inverting output of the latch;

the output of the third inverter being the inverting output of the latch.

10. The gate driving apparatus according to claim 9, wherein, the third inverter comprising a fourth TFT and a fifth TFT, the second inverter comprising a sixth TFT and a seventh TFT;

the fourth TFT having a gate connected to a non-inverting control of the transmission gate, a source connected to a high-level output of a driving power, and a drain connected to a drain of the first TFT;

the fifth TFT having a gate connected to a non-inverting control of the transmission gate, a source connected to a low-level output of the driving power, and a drain connected to the drain of the first TFT;

the sixth TFT having a gate connected to the drain of the first TFT and an inverting control of the transmission gate respectively, a source connected to the high-level output of the driving power, and a drain connected to the non-inverting control of the transmission gate;

the seventh TFT having a gate connected to the drain of the first TFT and the inverting control of the transmission gate respectively, a source connected to the low-level output of the driving power, and a drain connected to the non-inverting control of the transmission gate;

the drain of the sixth TFT being the non-inverting output of the latch;

the drain of the fourth TFT being the inverting output of the latch;

the gate of the sixth TFT being the input of the second inverter, the gate of the fourth TFT being the input of the third inverter;

the fourth TFT and the sixth TFT being p-type TFTs;

the fifth TFT and the seventh TFT being n-type TFTs.

11. The gate driving apparatus according to claim 10, wherein, the transmission gate comprising an eighth TFT and a ninth TFT;

a source of the eight TFT being connected to a drain of the ninth TFT, and a source of the ninth TFT being connected to the drain of the eighth TFT;

the eighth TFT having the gate connected to the non-inverting output of the shifting register, the drain connected to a clock signal input;

the gate of the eighth TFT being the non-inverting control of the transmission gate, the gate of the ninth TFT being the inverting control of the transmission gate;

the eighth TFT being a n-type TFT and the ninth TFT being a p-type TFT.

12. The gate driving apparatus according to claim 11, wherein the first inverter comprising a tenth TFT and an eleventh TFT, wherein, the tenth TFT having a gate connected to the non-inverting output of the shifting register and a gate of the eleventh TFT respectively, a source connected to the low-level output of the driving power, and a drain connected to an inverting output of the shifting register and a drain of the eleventh TFT respectively;

the eleventh TFT having a source connected to the high-level output of the driving power;

the gate of the tenth TFT being the input of the first inverter, and the drain of the tenth TFT being the output of the first inverter;

the tenth TFT being a n-type TFT and the eleventh TFT T11 being a p-type TFT.

\* \* \* \* \*